United States Patent
Noah et al.

(10) Patent No.: US 10,614,181 B2
(45) Date of Patent: Apr. 7, 2020

(54) ELECTRONIC DESIGN TOOLS USING NON-SYNTHESIZABLE CIRCUIT ELEMENTS

(71) Applicant: Mellanox Technologies, Ltd., Yokneam (IL)

(72) Inventors: Moshe Noah, Bat Yam (IL); Itamar Rabenstein, Petah Tikva (IL); Irit Granovsky, Yokneam Illit (IL)

(73) Assignee: Mellanox Technologies, Ltd., Yokneam (IL)

( * ) Notice: Subject to any disclaimer, the term of this patent is extended or adjusted under 35 U.S.C. 154(b) by 135 days.

(21) Appl. No.: 15/891,395

(22) Filed: Feb. 8, 2018

(65) Prior Publication Data

US 2019/0243936 A1    Aug. 8, 2019

(51) Int. Cl.
*G06F 17/50*    (2006.01)

(52) U.S. Cl.
CPC ........ *G06F 17/5022* (2013.01); *G06F 17/505* (2013.01)

(58) Field of Classification Search
None
See application file for complete search history.

(56) References Cited

U.S. PATENT DOCUMENTS

| | | | |
|---|---|---|---|
| 8,352,898 B1 * | 1/2013 | Kellermann | G06F 17/5054 716/116 |
| 8,370,788 B2 * | 2/2013 | Lo | G06F 17/5045 716/102 |
| 2004/0117167 A1 * | 6/2004 | Neifert | G06F 17/5022 703/14 |
| 2010/0281443 A1 | 11/2010 | Lo et al. | |
| 2017/0255731 A1 * | 9/2017 | Chou | G06F 9/3001 |
| 2019/0205491 A1 * | 7/2019 | Castle | G06F 17/504 |

OTHER PUBLICATIONS

J.D. S. Babcock et al., "Extended VHDL for the Rapid Prototyping of Systems with Synthesizable and Nonsynthesizable Subsystems," 1994 IEEE, pp. 146-152. (Year: 1994).*

J.D. S. Babcock et al., "A Case Study of SYstem Synthesis with Non-Synthesizable Components using Extended VHDL," 1995 IEEE, pp. 168-173. (Year: 1995).*

(Continued)

*Primary Examiner* — Leigh M Garbowski
(74) *Attorney, Agent, or Firm* — Kligler & Associates Patent Attorneys Ltd

(57) ABSTRACT

A method for circuit design automation includes appending a non-synthesizable input having a unique identifier to HDL code that specifies a physical input of the circuit. For the physical components in the circuit to which a signal from the physical input is to propagate, corresponding non-synthesizable components are appended, having respective identifiers assigned responsively to the unique identifier of the non-synthesizable input, to the HDL code that specifies the physical components. The design is verified by simulating operation of the circuit using the HDL code, including both the physical and non-synthesizable inputs and components. After verifying the design, a netlist synthesis tool automatically generates a netlist of the circuit including the physical inputs and components while omitting the non-synthesizable inputs and components.

19 Claims, 3 Drawing Sheets

(56) References Cited

OTHER PUBLICATIONS

M.R. Kakoee et al., "Generating RTL Synthesizable Code from Behavioral Teshbenches for Hardware-Accelerated Verification," 11th Euromicro Conference on Digital System Design Architectures, Methods and Tools, 2008 IEEE Computer Society, pp. 714-720. (Year: 2008).*

O. Amin et al., "System Verilog Assertions Synthesis Based Compiler," 2016 17th Int'l Workshop on Microprocessor and SOC Test and Verification, 2016 IEEE, pp. 65-70. (Year: 2016).*

Cadence Design Systems Inc., "Genus Synthesis Solution", 3 pages, 2018.

Cadence Design Systems Inc., "Incisive Enterprise Simulator", 7 pages, 2011.

* cited by examiner

ELECTRONIC DESIGN TOOLS USING NON-SYNTHESIZABLE CIRCUIT ELEMENTS

FIELD OF THE INVENTION

The present invention relates generally to electronic circuit design tools, and specifically to methods, apparatus and software used in facilitating design simulation and verification.

BACKGROUND

Semiconductor chip designers commonly write their circuit design definitions in a high-level design language, such as a register-transfer level (RTL) definition written in a standardized hardware-description language (HDL), for example Verilog or VHDL. Designers then use simulation tools to debug the design and verify that it will function as required by the circuit specification. A variety of simulation and verification tools that can be used for these purposes are known in the art, such as the Incisive® Enterprise Simulator offered by Cadence Design Systems, Inc. (San Jose, Calif.).

Once the RTL circuit definition has been completed and verified, it is synthesized automatically into a gate-level netlist. Synthesis tools for this purpose include, for example, the Genus™ Synthesis Solution offered by Cadence Design Systems, Inc. Other companies, such as Synopsys, Inc. (Mountain View, Calif.), offer comparable simulation, verification, and synthesis tools. After synthesis of the netlist, the design process continues, using the netlist, to physical design and layout.

SUMMARY

Embodiments of the present invention that are described hereinbelow provide methods, apparatus and software for electrical circuit design.

There is therefore provided, in accordance with an embodiment of the invention, a method for circuit design automation. The method includes, in hardware description language (HDL) code defining a design of a circuit, appending a non-synthesizable input having a unique identifier to the HDL code that specifies a physical input of the circuit. For each of a plurality of physical components in the circuit to which a signal from the physical input is to propagate, corresponding non-synthesizable components are appended, having respective identifiers assigned responsively to the unique identifier of the non-synthesizable input, to the HDL code that specifies the physical components. The design is verified, using the assigned identifiers, by simulating operation of the circuit using the HDL code, including both the physical and non-synthesizable inputs and components. After verifying the design, a netlist synthesis tool is applied to the HDL code, including both the physical and non-synthesizable inputs and components, to automatically generate a netlist of the circuit including the physical inputs and components while omitting the non-synthesizable inputs and components.

In a disclosed embodiment, the non-synthesizable input and components are preceded in the HDL code by a translate-off command.

Additionally or alternatively, appending the corresponding non-synthesizable components includes adding a non-synthesizable memory component to a physical memory component in the HDL code.

Typically, applying the netlist synthesis tool includes using the same HDL code, including both the physical and non-synthesizable inputs and components, in generating the netlist as was used in verifying the design.

In one embodiment, defining the design of the circuit includes specifying the physical input and the plurality of physical components using structs, each struct defining a respective group of a physical circuit element and a corresponding non-synthesizable circuit element.

In a disclosed embodiment, verifying the design includes identifying a bug in simulating the operation of the circuit, and tracing the bug to the physical input using at least one of the identifiers of the non-synthesizable components. Additionally or alternatively, verifying the design includes identifying an anomalous output in simulating the operation of the circuit, and tracing the anomalous output to the physical input using the unique identifier of the non-synthesizable input.

There is also provided, in accordance with an embodiment of the invention, apparatus for circuit design automation, including a memory configured to store hardware description language (HDL) code defining a design of a circuit. One or more processors are configured to append a non-synthesizable input having a unique identifier to the HDL code that specifies a physical input of the circuit, and for each of a plurality of physical components in the circuit to which a signal from the physical input is to propagate, to append corresponding non-synthesizable components, having respective identifiers assigned responsively to the unique identifier of the non-synthesizable input, to the HDL code that specifies the physical components. The one or more processors are configured to verify the design, using the assigned identifiers, by simulating operation of the circuit using the HDL code, including both the physical and non-synthesizable inputs and components, and after verifying the design, to submit the HDL code, including both the physical and non-synthesizable inputs and components, to a netlist synthesis tool, which automatically generates a netlist of the circuit including the physical inputs and components while omitting the non-synthesizable inputs and components.

There is additionally provided, in accordance with an embodiment of the invention, a computer software product, including a non-transitory computer-readable medium in which program instructions are stored, which instructions, when read by a computer, cause the computer to receive hardware description language (HDL) code defining a design of a circuit, and to append a non-synthesizable input having a unique identifier to the HDL code that specifies a physical input of the circuit, and for each of a plurality of physical components in the circuit to which a signal from the physical input is to propagate, to append corresponding non-synthesizable components, having respective identifiers assigned responsively to the unique identifier of the non-synthesizable input, to the HDL code that specifies the physical components. The instructions cause the computer to verify the design, using the assigned identifiers, by simulating operation of the circuit using the HDL code, including both the physical and non-synthesizable inputs and components, and after verifying the design, to submit the HDL code, including both the physical and non-synthesizable inputs and components, to a netlist synthesis tool, which automatically generates a netlist of the circuit including the physical inputs and components while omitting the non-synthesizable inputs and components.

The present invention will be more fully understood from the following detailed description of the embodiments thereof, taken together with the drawings in which:

DETAILED DESCRIPTION OF EMBODIMENTS

Figure 1:
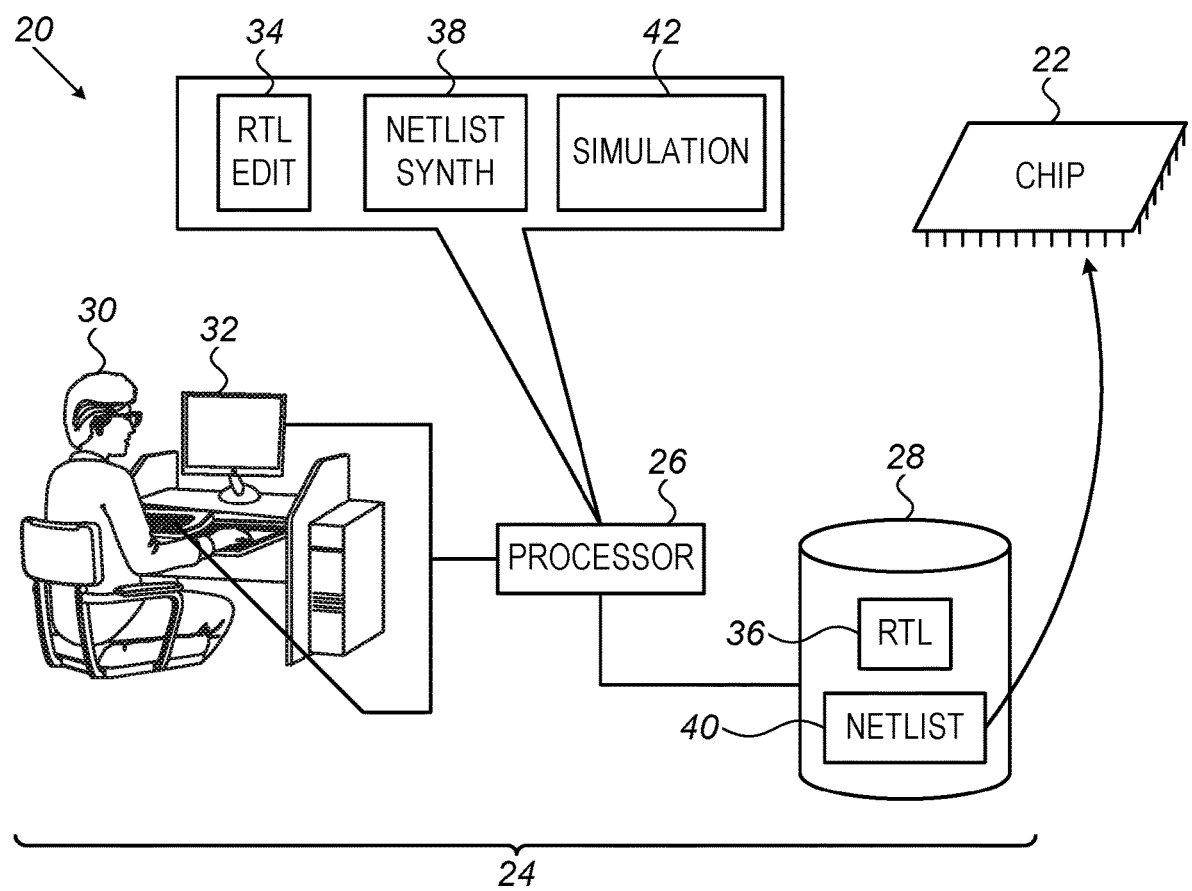
FIG. 1 is a block diagram that schematically illustrates a system for circuit design automation, in accordance with an embodiment of the invention.

Despite the availability of powerful simulation tools, debugging the HDL code that defines a complicated circuit design is generally difficult and time-consuming. When an anomalous signal appears in a simulation trace, or the simulated circuit yields an anomalous output, the designer must often trace the signal or output back through the circuit to its source in order to find and correct the bug causing the anomaly. In many cases, the bug will be in a different part of the circuit from the one in which the anomaly was detected, and the signal paths leading back through the circuit will be lengthy and complex.

A naïve solution to this problem might be to add unique identifiers to the inputs of the circuit in the HDL code, and to assign corresponding identifiers to the circuit components to which signals from each of the inputs propagate. When an anomaly occurs at a given element of the circuit, the identifier assigned to this element, along with the identifiers of preceding elements along the signal path, will give the designer a strong hint as to where the bug can be found. When the design has been debugged and is synthesized, however, the synthesis tool will need to add gates and memory components to the netlist in order to accommodate the identifiers. These added circuit elements will increase the size, cost and power consumption of the final circuit. For this reason, this naïve solution, though convenient for the designer, is not practical.

Embodiments of the present invention that are described herein address this problem by using non-synthesizable circuit elements, which are appended to certain physical elements in the HDL definition of the circuit design. The term "non-synthesizable," as used in the context of the present description and in the claims, refers to elements that are defined in the HDL code in such a way as to be automatically omitted from the netlist by synthesis tools, while still representing an operative part of the circuit during simulation. Hardware definition languages that are known in the art, such as Verilog and VHDL, include commands that can be used for this purpose, such as a translate-off command preceding the non-synthesizable element, followed by a translate-on command thereafter.

In the disclosed embodiments, a non-synthesizable input of this sort, having a unique identifier, is appended to the HDL code that specifies a physical input of the circuit. For each of the physical components in the circuit to which a signal from this physical input is to propagate (or for at least some of these physical components), a corresponding non-synthesizable component is also appended to the HDL code that specifies the physical component. These non-synthesizable components along the signal path also have respective identifiers, which are assigned depending on the unique identifier of the non-synthesizable input, and they are connected by wires defined in the HDL code that are parallel to the wires connecting the physical components. Typically (although not necessarily), multiple non-synthesizable inputs are added to the HDL code in this manner, each input having its own unique identifier. The non-synthesizable components downstream from each input then receive identifiers that are equal to the unique identifier of the input or are generated by some predefined function of the preceding identifiers on the signal paths, such as incrementing, summing, or concatenating the identifiers.

The HDL code, including both the physical and non-synthesizable inputs and components, is input to a simulation tool, which simulates the operation of the circuit. This simulation includes both the physical and non-synthesizable inputs and components, as though they were all actual, physical elements of the circuit under test. Thus, if a bug or anomalous output is identified at a certain point in the simulated circuit, the designer can use the identifier of the non-synthesizable component at that point in tracing the signal back to the input from which it originated, based on the unique identifiers of the non-synthesizable inputs.

After the design has been verified by simulation, the very same HDL code, including both the physical and non-synthesizable inputs and components, can be input to an automatic netlist synthesis tool. The synthesis tool automatically generates a netlist of the circuit comprising the physical inputs and components while omitting the non-synthesizable inputs and components. Wires that interconnected the non-synthesizable elements in the HDL code are seen by the netlist synthesis tool as unconnected wires, and are therefore eliminated from the netlist automatically. Consequently, there is no need for the designer to make any changes in the HDL code after simulation. The inventors have found that the circuit that is synthesized from the HDL code in this manner will be no larger (or at most only a few percent larger) than the circuit that would have been synthesized in the absence of the non-synthesizable components.

FIG. 1 is a block diagram that schematically illustrates a system 20 for design of an integrated circuit chip 22, in accordance with an embodiment of the invention. System 20 comprises a design automation station 24, which is built, in the illustrated embodiment, on a general-purpose computer, comprising at least one processor 26 and a memory 28. Alternatively, the functions of station 24 that are described herein may be distributed among multiple processors, on one, two or more separate computers. These functions of station 24 are typically implemented in software, which runs on processor 26. The software may be downloaded to station 24 in electronic form, over a network, for example. Additionally or alternatively, the software may be stored on non-transitory, tangible media, such as optical, magnetic or electronic memory media.

A user 30 of system 20, such as a VLSI circuit designer, generates HDL code defining the design of the circuits in chip 22, for example an RTL definition 36 of the chip, by operating a user interface 32 of station 24 to interact with an RTL editor 34 running on processor 26. As explained earlier, in the present embodiment RTL definition 36 includes both physical elements and corresponding non-synthesizable elements with respective identifiers. In order to debug and verify the design, user invokes a simulation tool 42, which simulates the operation of chip 22, including both the physical and non-synthesizable inputs and components.

Once the RTL definition has been completed, debugged and verified, user 30 invokes a netlist synthesizer 38 (also a software component) running on processor 26 to automatically convert RTL definition 36 into a gate-level netlist 40. This netlist includes the physical inputs and components but omits the non-synthesizable inputs and components that were incorporated in the RTL definition for purposes of simulation. The netlist is then used in subsequent steps of the actual physical design of chip 22. These latter steps are beyond the scope of the present description. Although only a single user 30 is shown in the figure for the sake of simplicity, in practice the design of chip 22 is typically a collaborative effort, involving multiple engineers, including one or more engineers who develop the RTL definition and others who work on the netlist and physical design.

Figure 2:
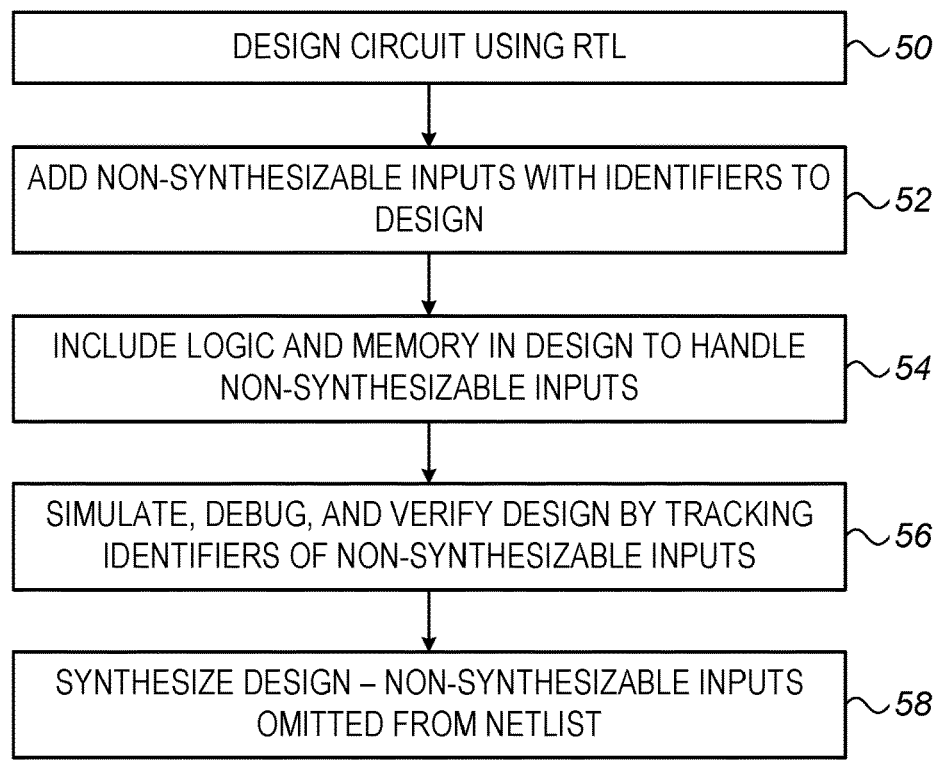
FIG. 2 is a flow chart that schematically illustrates a method for circuit design, checking and synthesis, in accordance with an embodiment of the invention.
Figure 3:
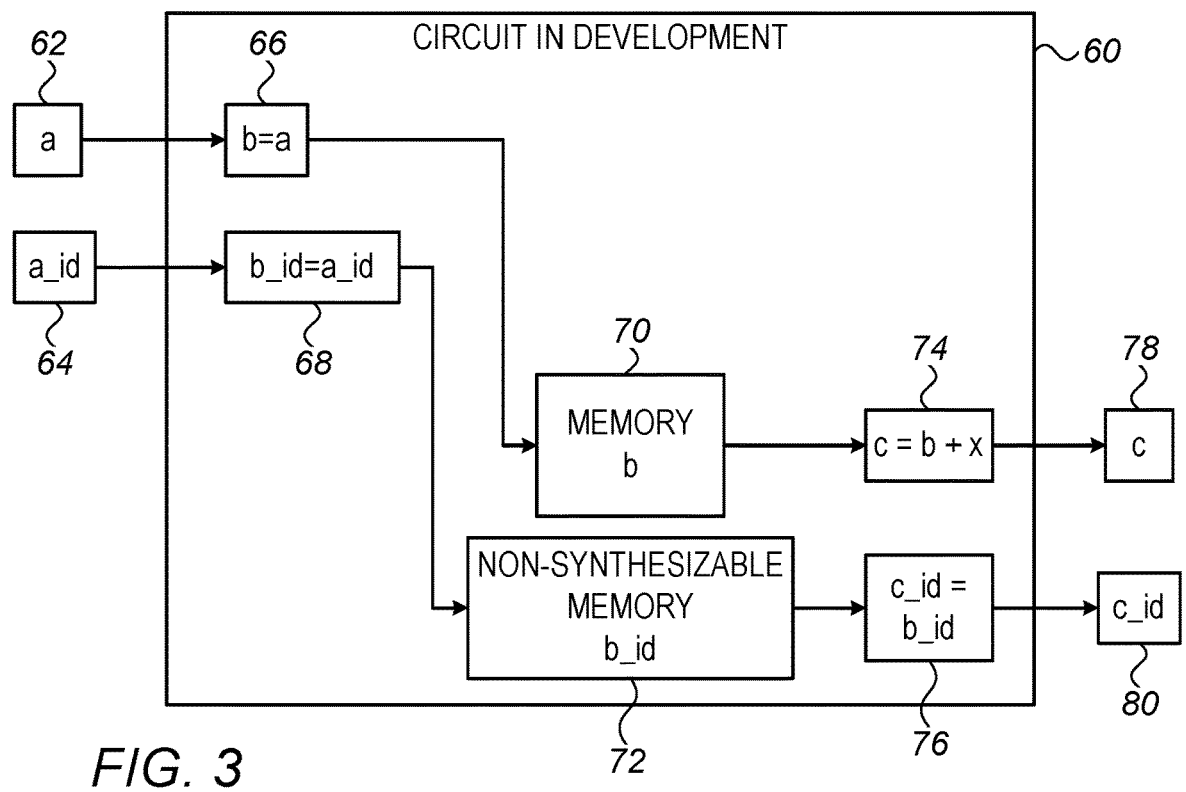
FIG. 3 is a block diagram that schematically illustrates a circuit in development, in accordance with an embodiment of the invention.

Reference is now made to FIGS. 2 and 3, which schematically illustrate a method for circuit design, checking and synthesis, in accordance with an embodiment of the invention. FIG. 2 is a flow chart showing steps in the disclosed method, while FIG. 3 is a block diagram illustrating a simplified circuit 60 in development using the method of FIG. 2. The method is described, for the sake of clarity and concreteness, with reference to the elements of system 20 (FIG. 1) and circuit 60, but may alternatively be applied in other system environments and on circuits of much greater complexity.

User 30 designs circuit 60 using RTL editor 34, at a circuit design step 50. In this example, circuit 60 has a physical input 62, labeled "a". User 30 appends non-synthesizable inputs having unique identifiers to the RTL code that specifies the physical inputs of circuit 60, at an input identification step 52. In the pictured example, a non-synthesizable input 64, labeled "a_id", is appended to physical input 62, with a unique identifier represented by the suffix "id". As explained earlier, the RTL definition of non-synthesizable input 64, as well as of other non-synthesizable components in circuit 60, can be preceded in the RTL code by a "translate-off" command, and then followed by a "translate-on" command to resume specification of the synthesizable elements. In Verilog, for example, these commands have the form "// synthesis translate_off" and "// synthesis translate_on". The equivalent commands in VHDL are written "-- synthesis translate_off" and "-- synthesis translate_on".

User 30 continues the design of circuit 60, including both physical and corresponding non-synthesizable components, at a component specification step 54. The physical components in this case include a memory 70, which holds a value (or an array of values) labeled "b", along with logic that includes a logical wire 66 connecting input to memory 70 and another logical wire 74 connecting memory 70 to an output 78, labeled "c". Wire 66 represents simply the assignment "b=a", while wire 74 represents an addition operation, yielding output 78.

As the signal from physical input 62 will propagate to physical memory 70, user 30 adds a corresponding non-synthesizable memory 72 at step 54, and assigns the identifier "id" of non-synthesizable input 64 to memory 72 (labeled "b_id" in FIG. 3). As noted earlier, the identifier of memory 72 may be identical to the unique identifier ("id") of input 64, as in the present example, or it may be based on some function of "id". Other non-synthesizable memory components, such as flip-flops and arrays of memory cells, are likewise appended to corresponding physical memory components in RTL definition 36. Non-synthesizable input 64 is connected to non-synthesizable memory 72 by a logical wire 68, which is parallel to wire 66 and represents the assignment b_id=a_id. Similarly, non-synthesizable memory 72 is connected by a logical wire 76, parallel to wire 74, to a non-synthesizable output 80, labeled "c_id".

User 30 may carry out step 54 manually, using editor 34 to add each of the non-synthesizable components to RTL definition 36 of circuit 60 in the same manner in which the physical components are introduced and interconnected. Alternatively, step 54 may be partially automated, for example using structs that simultaneously define respective groups of physical and non-synthesizable components of the circuit. A struct is a composite data type that defines a grouped list of variables to be placed under one name and accessed via a single pointer. In an embodiment of the present invention, the user specifies the physical input and the physical components using structs, which also include the corresponding non-synthesizable circuit elements and handling of the identifiers that go with them. A simple compiler can then be applied to convert the structs into the appropriate groups of physical and non-synthesizable circuit elements in the appropriate RTL format.

Once step 54 has been completed (whether manually or automatically), and the non-synthesizable circuit elements have been added to RTL definition 36 with the appropriate identifiers, simulation tool 42 is applied to test the RTL definition, at a verification step 56. When a bug is identified in the course of step 56, user 30 can often take advantage of the identifiers of the non-synthesizable components in tracing the bug back to its source. A scenario of this sort is shown below, for example, in FIG. 4. After fixing the cause of the bug, the user may rerun the simulation to verify that the bug has indeed been resolved.

Additionally or alternatively, non-synthesizable output 80 may be used in the verification stage of the simulation to trace back anomalous results appearing at physical output 78. For example, assuming circuit 60 is designed for processing data packets and has multiple inputs (rather than only the single physical input 62 that is shown in FIG. 3), the identifiers observed at the non-synthesizable outputs can be used to identify the sources of packets that have passed through circuit 60. Thus, when packets reach physical output 78 out of order or contain incorrect data, the corresponding packets received at non-synthesizable output 80 can be analyzed to identify the cause of the problem. When all packets in the test suite are processed properly at step 56, this stage of simulation-based verification can be considered complete. (Other sorts of verification, such as formal verification, may also be applied to RTL definition 36 but are beyond the scope of the present description.)

After verifying the design, user 30 submits RTL definition 36, including both the physical and non-synthesizable inputs and components, to netlist synthesis tool 38, at a synthesis step 58. Synthesis tool 38 automatically generates a netlist of circuit 60, comprising physical input 62 and other physical components 66, 70, 74, 78, . . . . Non-synthesizable components, such as input 64, memory 72 and output 80, are automatically omitted from the netlist because of the "translate-off" commands that precede them in the RTL code. Synthesis tool 38 automatically removes unconnected wires as part of its normal functionality, and therefore will also omit wires 68 and 76 from the netlist, even if they were not marked as non-synthesizable, because in the absence of input 64, memory 72 and output 80, wires 68 and 76 are now unconnected and thus not synthesizable.

Figure 4:
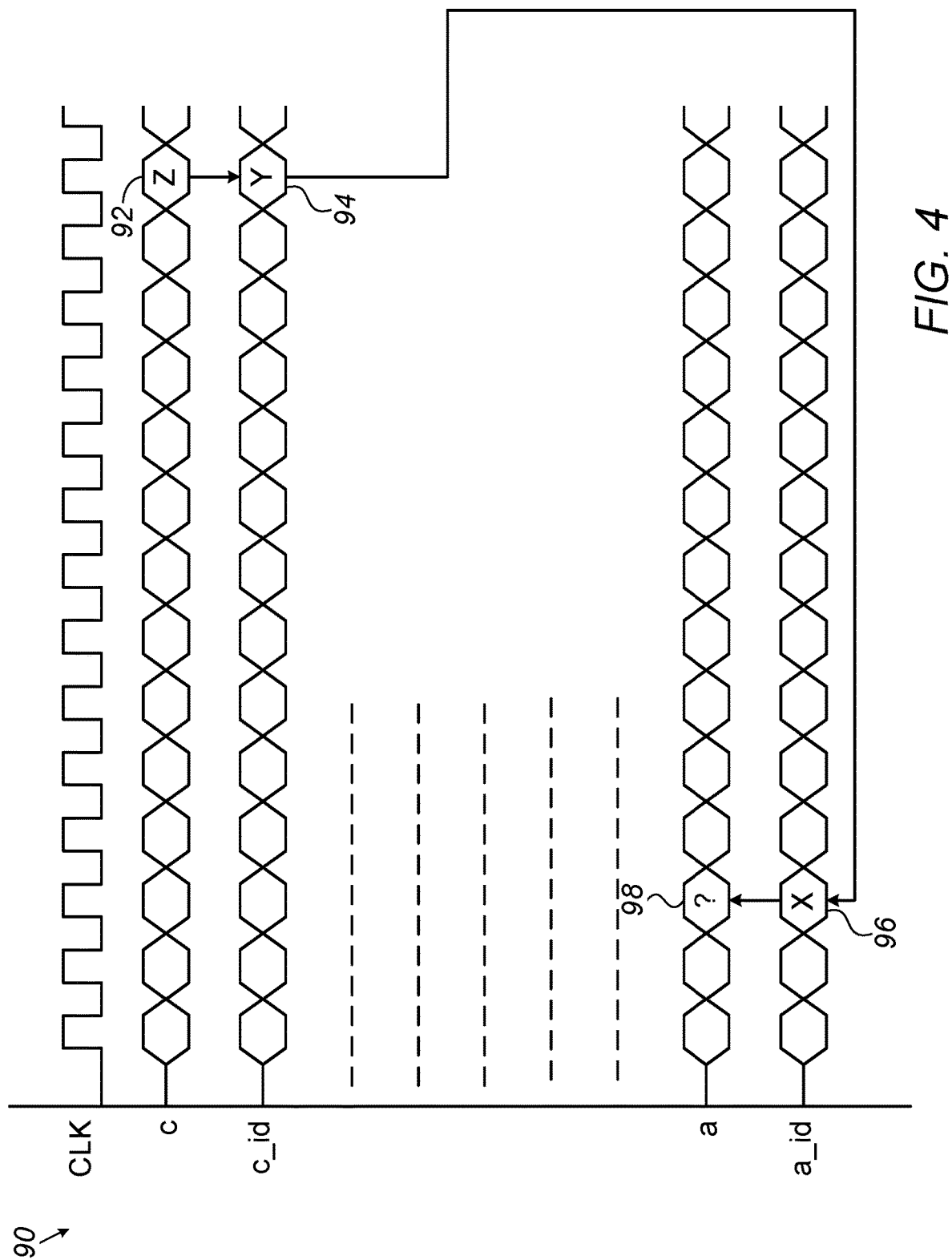
FIG. 4 is a schematic representation of a timing diagram generated in simulation of the circuit of FIG. 3, in accordance with an embodiment of the invention.

FIG. 4 is a schematic representation of a timing diagram generated in simulation of circuit 60 (FIG. 3), in accordance with an embodiment of the invention. In this example, simulation tool 42 generates signals 90 as a function of time, representing data values at various points in circuit 60. An anomalous value 92 (Z) appears at a certain time on physical component c, but the origin of this anomalous value is not known. In order to trace the cause of the anomaly, user 30 notes that at the same time as the value Z appears on component c, a value 94 (Y) appears on the corresponding non-synthesizable component c_id.

By virtue of the identifier "id", user 30 knows that the origin of the signal on component c_id is from the non-synthesizable input a_id. The user inspects the earlier values of a_id and identifies an input value 96 (X), which occurred many cycles earlier in the simulation, as having given rise to value 94 (Y) of c_id. Since the circuit path from a_id to c_id runs parallel to the path from physical input a to physical component c, user 30 is able to ascertain that a value 98 of input a is the cause of value 92 having appeared many cycles later on component c.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for circuit design automation, comprising:
in hardware description language (HDL) code defining a design of a circuit interconnecting a physical input, physical components, and a physical output, appending a non-synthesizable input to the circuit, in order to carry corresponding identifiers of signals passing into the physical input of the circuit;
for each of a plurality of the physical components in the circuit to which a signal from the physical input is to propagate, appending corresponding non-synthesizable components;
interconnecting the non-synthesizable components to the non-synthesizable input;
verifying the design, by simulating operation of the circuit using the HDL code, wherein the simulating includes introducing multiple signals to the physical input and introducing corresponding identifiers to the non-synthesizable input; and
after verifying the design, applying to the HDL code, including both the physical and non-synthesizable inputs and components, a netlist synthesis tool, which automatically generates a netlist of the circuit comprising the physical inputs and components while omitting the non-synthesizable inputs and components.

2. The method according to claim 1, wherein the non-synthesizable input and components are preceded in the HDL code by a translate-off command.

3. The method according to claim 1, wherein appending the corresponding non-synthesizable components comprises adding a non-synthesizable memory component to a physical memory component in the HDL code.

4. The method according to claim 1, wherein applying the netlist synthesis tool comprises using the same HDL code, including both the physical and non-synthesizable inputs and components, in generating the netlist as was used in verifying the design.

5. The method according to claim 1, wherein the appending of the corresponding non-synthesizable components comprises specifying the physical input and the plurality of physical components using structs, each struct defining a respective group of a physical circuit element and a corresponding non-synthesizable circuit element.

6. The method according to claim 1, wherein verifying the design comprises identifying an anomalous output in simulating the operation of the circuit, and tracing the anomalous output to an input signal using an identifier on the non-synthesizable output.

7. The method according to claim 1, wherein the HDL code defining the design of the circuit is generated by a user using an RTL editor, and wherein the appending of the corresponding non-synthesizable components comprises appending manually by a user using the RTL editor.

8. Apparatus for circuit design automation, comprising:
a memory configured to store hardware description language (HDL) code defining a design of a circuit interconnecting a physical input, physical components, and a physical output; and
one or more processors, which are configured to append a non-synthesizable input to the circuit, in order to carry corresponding identifiers of signals passing into the physical input of the circuit, and for each of a plurality of the physical components in the circuit to which a signal from the physical input is to propagate, to append corresponding non-synthesizable components, and to interconnect the non-synthesizable components to the non-synthesizable input,
wherein the one or more processors are configured to verify the design by simulating operation of the circuit using the HDL code, wherein the simulating includes introducing multiple signals to the physical input and introducing corresponding identifiers to the non-synthesizable inputs and after verifying the design, to submit the HDL code, including both the physical and non-synthesizable inputs and components, to a netlist synthesis tool, which automatically generates a netlist of the circuit comprising the physical inputs and components while omitting the non-synthesizable inputs and components.

9. The apparatus according to claim 8, wherein the non-synthesizable input and components are preceded in the HDL code by a translate-off command.

10. The apparatus according to claim 8, wherein the corresponding non-synthesizable components comprise a non-synthesizable memory component appended to a physical memory component in the HDL code.

11. The apparatus according to claim 8, wherein the netlist synthesis tool uses the same HDL code, including both the physical and non-synthesizable inputs and components, in generating the netlist as was used in verifying the design.

12. The apparatus according to claim 8, wherein the physical input and the plurality of physical components are specified using structs, each struct defining a respective group of a physical circuit element and a corresponding non-synthesizable circuit element.

13. The apparatus according to claim 8, wherein verifying the design comprises identifying an anomalous output in simulating the operation of the circuit, and tracing the anomalous output to an input signal using an identifier on the non-synthesizable output.

14. A computer software product, comprising a non-transitory computer-readable medium in which program instructions are stored, which instructions, when read by a computer, cause the computer to receive hardware description language (HDL) code defining a design of a circuit interconnecting a physical input, physical components, and a physical output, and to append a non-synthesizable input to the circuit, in order to carry corresponding identifiers of signals passing into the physical input of the circuit, and for each of a plurality of the physical components in the circuit to which a signal from the physical input is to propagate, to append corresponding non-synthesizable components, and to interconnect the non-synthesizable components to the non-synthesizable input, wherein the instructions cause the computer to verify the design by simulating operation of the circuit using the HDL code, wherein the simulating includes introducing multiple signals to the physical input and introducing corresponding identifiers to the non-synthesizable inputs, and after verifying the design, to submit the HDL code, including both the physical and non-synthesizable inputs and components, to a netlist synthesis tool, which automatically generates a netlist of the circuit comprising the physical inputs and components while omitting the non-synthesizable inputs and components.

15. The product according to claim 14, wherein the non-synthesizable input and components are preceded in the HDL code by a translate-off command.

16. The product according to claim 14, wherein the corresponding non-synthesizable components comprise a non-synthesizable memory component appended to a physical memory component in the HDL code.

17. The product according to claim 14, wherein the netlist synthesis tool uses the same HDL code, including both the physical and non-synthesizable inputs and components, in generating the netlist as was used in verifying the design.

18. The product according to claim 14, wherein the physical input and the plurality of physical components are specified using structs, each struct defining a respective group of a physical circuit element and a corresponding non-synthesizable circuit element.

19. The product according to claim 14, wherein verifying the design comprises identifying an anomalous output in simulating the operation of the circuit, and tracing the anomalous output to an input signal using an identifier on the non-synthesizable output.

\* \* \* \* \*